Figure 1:
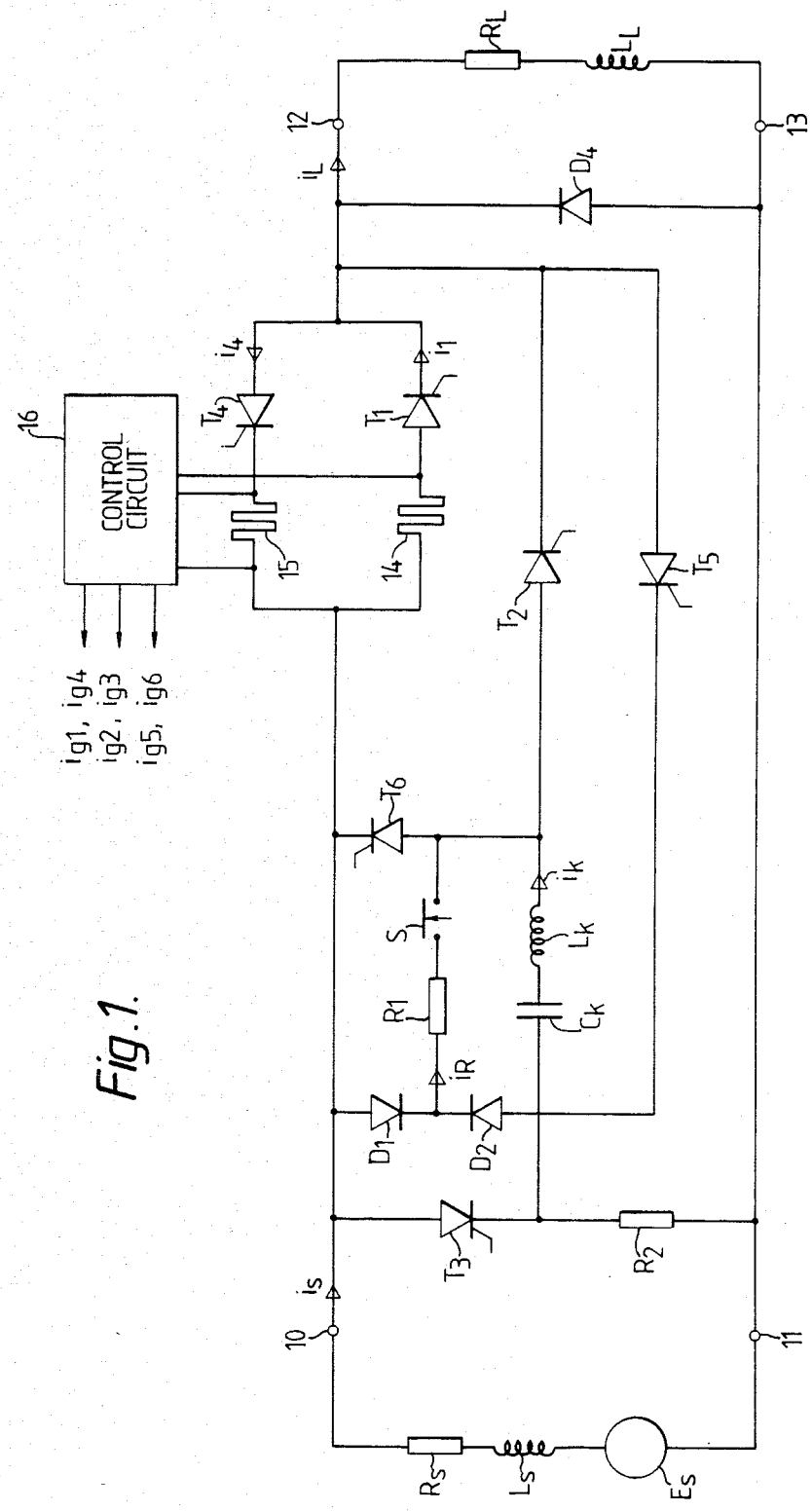

United States Patent [19]

McEwan et al.

[11] Patent Number: 4,686,393

[45] Date of Patent: Aug. 11, 1987

[54] CIRCUIT BREAKERS FOR DIRECT AND ALTERNATING CURRENT

[75] Inventors: Peter M. McEwan; Iorwerth Thomas, both of Preston, England

[73] Assignee: National Research Development Corporation, London, England

[21] Appl. No.: 696,493

[22] Filed: Jan. 30, 1985

[30] Foreign Application Priority Data

Feb. 1, 1984 [GB] United Kingdom ............... 8402629

[51] Int. Cl.⁴ .................................................. H02H 3/08
[52] U.S. Cl. ........................................ 307/31; 318/345 R; 363/124; 363/135
[58] Field of Search ......... 307/31; 318/345 R, 345 A, 318/345 B, 345 AB, 345 G, 345 H, 139; 363/27, 28, 37, 40, 44, 54, 57, 81, 85, 96, 124, 125, 128, 135, 138; 323/237; 361/91, 100, 110, 111

[56] References Cited

U.S. PATENT DOCUMENTS

| 3,098,949 | 7/1963 | Goldberg . | |
|---|---|---|---|
| 3,532,900 | 10/1970 | Rhyne | 323/237 X |
| 3,558,982 | 1/1971 | Greenwood . | |
| 3,693,069 | 9/1972 | Kelley et al. | 323/237 |
| 3,986,098 | 10/1976 | Tamii et al. | 363/135 |
| 4,087,726 | 5/1978 | Bourguet et al. | 363/135 X |
| 4,093,980 | 6/1978 | Gurwicz | 363/124 X |
| 4,358,811 | 11/1982 | Arremann | 363/124 X |
| 4,471,277 | 9/1984 | Franz | 318/345 C X |

FOREIGN PATENT DOCUMENTS

| 82071 | 6/1983 | European Pat. Off. . | |
|---|---|---|---|
| 134508 | 3/1985 | European Pat. Off. . | |
| 135672 | 4/1985 | European Pat. Off. . | |
| 2923590 | 11/1980 | Fed. Rep. of Germany . | |
| 2068122 | 8/1971 | France . | |
| 762603 | 11/1956 | United Kingdom . | |
| 1071439 | 6/1967 | United Kingdom . | |
| 1121049 | 7/1968 | United Kingdom . | |
| 1235713 | 6/1971 | United Kingdom . | |
| 1262767 | 2/1972 | United Kingdom . | |
| 1283349 | 7/1972 | United Kingdom . | |
| 1389160 | 4/1975 | United Kingdom . | |
| 1389402 | 4/1975 | United Kingdom . | |
| 1432832 | 4/1976 | United Kingdom . | |
| 1444570 | 8/1976 | United Kingdom . | |
| 1453686 | 10/1976 | United Kingdom . | |
| 1456751 | 11/1976 | United Kingdom . | |
| 1464862 | 2/1977 | United Kingdom . | |
| 1475142 | 6/1977 | United Kingdom . | |
| 1602019 | 11/1981 | United Kingdom . | |
| 2215241 | 2/1984 | United Kingdom . | |
| 2136227 | 9/1984 | United Kingdom | 307/131 |

Primary Examiner—William M. Shoop, Jr.
Assistant Examiner—Shik Luen Paul Ip
Attorney, Agent, or Firm—Cushman, Darby & Cushman

[57] ABSTRACT

Circuit breakers which employ a capacitor to pass a current in opposition to a load current through a thyristor when interruption is required suffer from the disadvantage that high switching over-voltages occur. In the present invention current is diverted from the main first thyristor through a resistor when second and third thyristors are fired to pass a commutating current from a capacitor through the first thyristor. As a result the values of the resistor and the capacitor control the over-voltage and they are chosen to reduce it to approximately half the value obtained with equivalently rated conventional thyristor-based circuit breakers. In a second stage of commutation a fourth thyristor is fired to pass commutating current through the second thyristor to effect final interruption of the load current and the values of a parallel resistance-capacitance circuit in series with the second thyristor are chosen to reduce a second over-voltage which occurs when the second thyristor is commutated.

18 Claims, 13 Drawing Figures

CIRCUIT BREAKERS FOR DIRECT AND ALTERNATING CURRENT

The present invention relates to direct and alternating current circuit breakers for switching a diverse range of load currents and for interrupting load currents when current becomes excessive. The invention is particularly useful in connection with thyristor circuit breakers but other devices may be used, for example vacuum interrupters are typically employed for high voltage working or where comparatively low power loss is required in the circuit breaker itself.

Known thyristor circuit breakers usually rely on charge held by a commutation capacitor to supply a current which, when the circuit breaker is to interrupt, opposes current flowing through the breaker in a series connected thyristor. The current in the thyristor is reduced to zero by the current from the capacitor and the thyristor ceases to conduct.

In such circuit breakers current interruption is accompanied by the generation of an over-voltage at output terminals of the breaker. The over-voltage is typically of the order of four to five times the circuit supply voltage. The occurrence of such relatively high voltages means that components used in the circuit breaker, any connected load and the supply must be rated to withstand these voltages.

Some circuit breakers of the above mentioned type have the advantage that the commutation capacitor is initially charged in that sense which opposes current in the thyristor and further the charge is derived directly from the supply by way of input terminals of the circuit breaker. Known circuit breakers of this type either generate relatively high over-voltages or can only be used for disconnecting loads having a small range of values. In the latter case, interruption of current in the circuit breaker itself depends for its operation on a resistor in the charging circuit being very roughly of equal value to the series combination of a second resistor in the charging circuit and the resistive component of the load. Alternatively known circuit breakers of this type can interrupt a wide range of loads if the two resistors are made very high in relation to the load impedance but then the problem of high over-voltage at the output terminals of the circuit breaker during current interruption is aggravated.

In Specification No. 1,262,767 (and equivalent U.S. Pat. No. 3,558,982), a.c. current is switched from main thyristors to a current limiting resistor when an over-current occurs but no attempt is made to control switching over-voltage and the preferred arrangement is expected to result in unnecessarily high over-voltages due to the decoupling inductances provided for the commutation capacitors.

According to the present invention there is provided a circuit breaker comprising first switching means connected to carry current between a first terminal and a second terminal of the circuit breaker, the first switching means being a gated switching means as hereinafter defined, control means for providing a switching signal when the switching circuit is required to cease carrying the said current, first commutation means including a capacitor means forming part of an inductance-capacitance circuit connected by way of second switching means across the first switching means, means for so charging the capacitor means that when the second switching means conducts, the capacitor means passes a current to the first switching means which oppose, and rises to equal, current between the first terminal and the second terminal causing the first switching means to cease conduction, provided that the current between the first and second terminals is not greater than a predetermined limit, the second switching means being set into a conducting state on the occurrence of the switching signal, resistive means connected to provide an alternative circuit or circuits, to substitute for the first switching means after current flow has ceased therein, for current passing into the circuit breaker by way of the first terminal, and second commutation means additional to the first commutation means for causing current through the resistive means to cease at the end of an interval which follows the cessation of current flow in the first switching means, the capacitor means being connected in the inductance-capacitance circuit to pass transient current flowing between the first and second terminals and store significant energy, so reducing the maximum switching over-voltage appearing at the second terminal, when the first switching means ceases conduction.

When the first switching means ceases to conduct, energy stored in the inductance of a power source connected to the circuit breaker is partly dissipated in the resistive means and partly transferred to the capacitor means, and while current in the resistive means is interrupted by the second commutation means, the energy stored in the capacitor means is dissipated. Preferably the source current at which circuit breaker operation is initiated is variable. To achieve maximum reduction in switching over-voltage, the values of the capacitor means and the resistive means are so chosen that, under short circuit conditions (with the circuit breaker set to the maximum source current value at which operation is initiated), approximately half the stored energy of the source (for example half the energy ±20%) is transferred to the capacitor means immediately following the first switching means ceasing conduction. Much of the energy is then dissipated in the resistance means before current therein is interrupted by the second commutation means. Two equal voltage peaks then occur, one during the first stage of interruption and one during the second stage.

Preferably the values of the resistive means and the capacitor means are chosen with the object of keeping the over-voltage peaks to a minimum and to provide an over damped current transient during the first stage.

A further advantage of the invention is that the rate of charge and discharge of the capacitor is so controlled by choice of capacitor and resistance means values that the switching over-voltage is reduced, usually to considerably less than half the supply voltage value. After the first switching means ceases to conduct a controlled portion of the current passing through the circuit breaker is arranged to by-pass the capacitor so reducing the amount of charge retained by the capacitor and therefore the voltage across it. Consequently a significant reduction occurs in the magnitude of the switching voltage appearing at, for example, the second terminal (relative to a common input/output terminal of the circuit breaker).

A further advantage of the resistive means is that for short-circuit fault conditions, the sustained short circuit current is limited by the resistive means.

The circuit breaker according to the invention may be constructed to interrupt direct current from the second terminal to the first terminal in addition to current flow in the opposite direction, or to interrupt alternating current, if the first switching means is capable of conducting current in both directions, and the second switching means and the capacitor means are capable of passing a current to the first switching means which opposes the current which flows therethrough at the time of interruption.

Thus when d.c. is to flow in one direction, the first switching means may comprise a single thyristor but when d.c. may flow in either direction, or a.c. current may flow, the first switching means may comprise two parallel connected, but oppositely poled thyristors. In the former case the second switching means may comprise two further thyristors and the capacitor means may comprise a single capacitor, the further thyristors being arranged to connect the capacitor and the resistive means across the said single thyristor in such a sense that the current from the capacitor opposes current flow in the single thyristor. In the latter case the second switching means may comprise two pairs of further thyristors and the capacitor means may comprise either, (preferably) one capacitor or two capacitors. Each pair of further thyristors may, in addition to connecting the resistive means across the parallel connected thyristors, be arranged to connect a respective one of the parallel connected thyristors across the single capacitor in a sense which causes current from the capacitor to oppose current in the thyristor.

If the second switching means includes gated switching means as hereinafter defined then the second commutation means may comprise third switching means connected to pass a current through the second switching means in a direction which opposes that current which flows therein after the first switching means has ceased conduction, the third switching means being set into a conducting state after the first switching means has ceased conduction. The circuit may then include means for controlling the rate of change of current in the second switching means, for example a parallel resistance-capacitance circuit in series with the second and third switching means and the capacitance means.

For a.c., the second commutation means may comprise the second switching means where the second switching means employs one or more gated switching means to connect the resistive means between the first and second terminals, since when current in the resistive means and the gated switching means tends to pass through a periodic zero, the gated switching means then ceases to conduct.

A further advantage therefore arises for a.c. current interruption, where the current through the components of the circuit breaker periodically passes through zero, since immediately following a zero, the second switching means (if it comprises one or more gated switching means) becomes non-conducting and the current through the circuit breaker is interrupted.

For d.c., the second commutation means may comprise switch means, for example a gate turn-off thyristor or a contactor, connected in series with the resistive means and the further thyristors across the first switching means.

The means for charging the capacitor means may simply comprise connections and terminals allowing the capacitor means to be charged from a supply external to the circuit breaker. Alternatively, the means for charging the capacitor means may comprise rectifier means and further resistive means connected to provide a path for d.c. between the first terminal and a common input-/output terminal of the circuit breaker. The said path may include the resistive means.

In this specification the term "gated switching means" denotes means which when current flows through the means remain in a low impedance state either until the current flow ceases or until both a control operation occurs and current flow ceases; substantial current does not flow again until a gating signal occurs. For example thyristors revert to a high impedance state when the anode/cathode current falls below zero but in a vacuum interrupter the electrodes must first state moving apart and then the current must cease before the impedance between the contacts is high.

Figure 2:
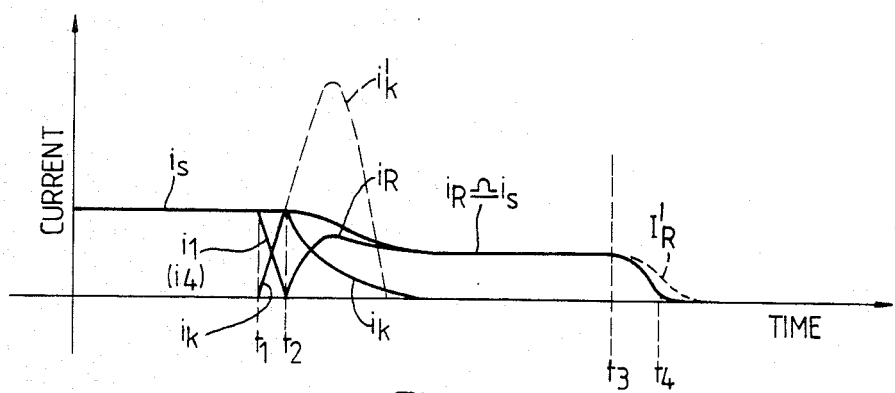
Figure 3:
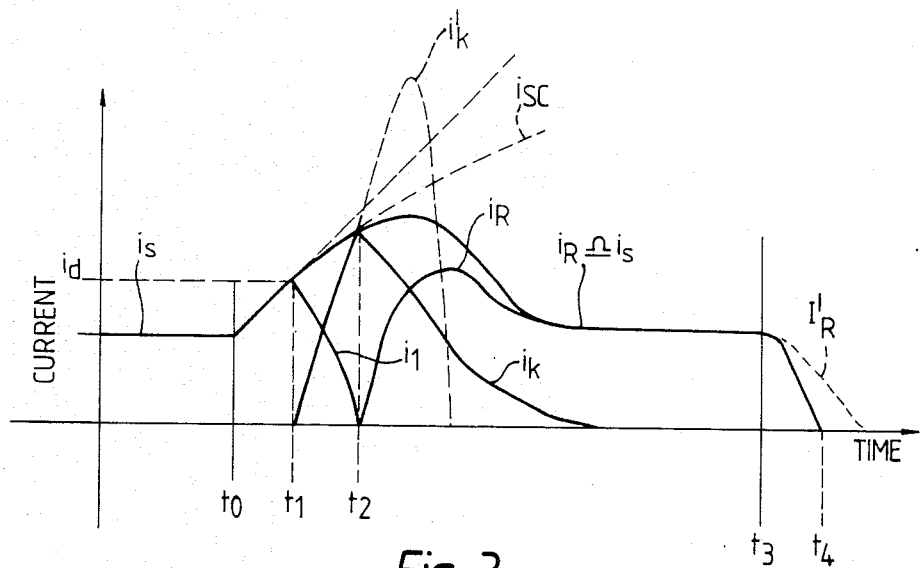
Figure 4:
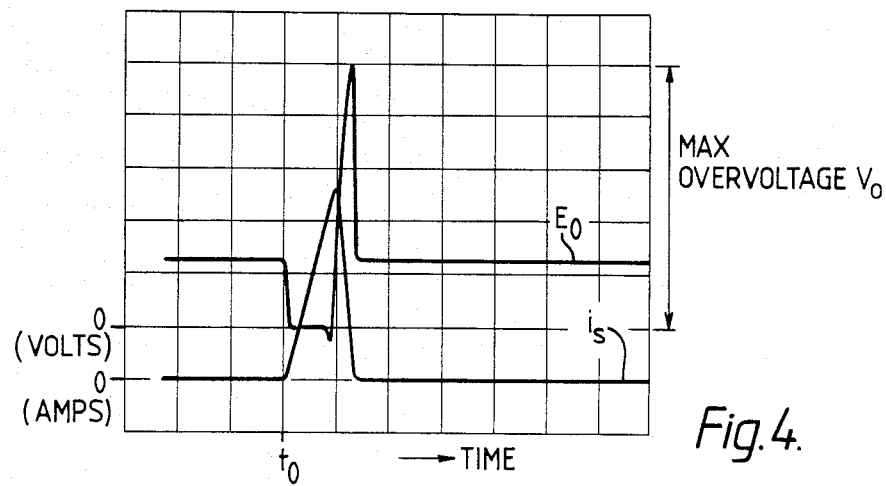
Figure 5:
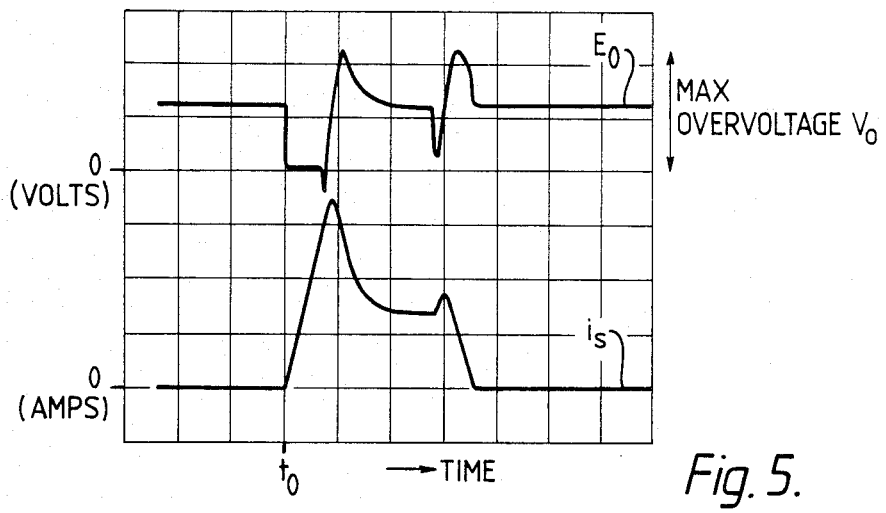
Figure 6:
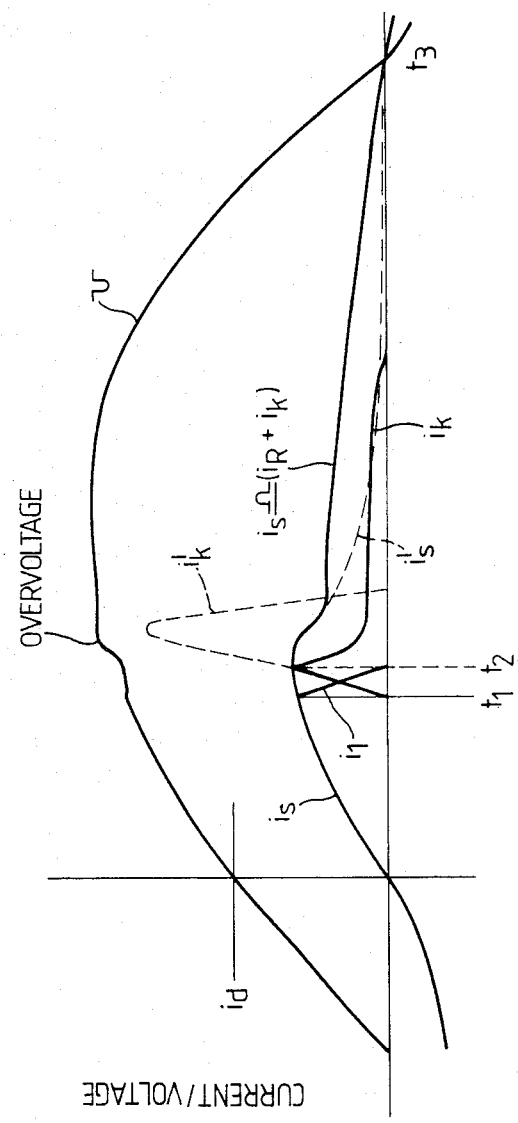
Figure 7:
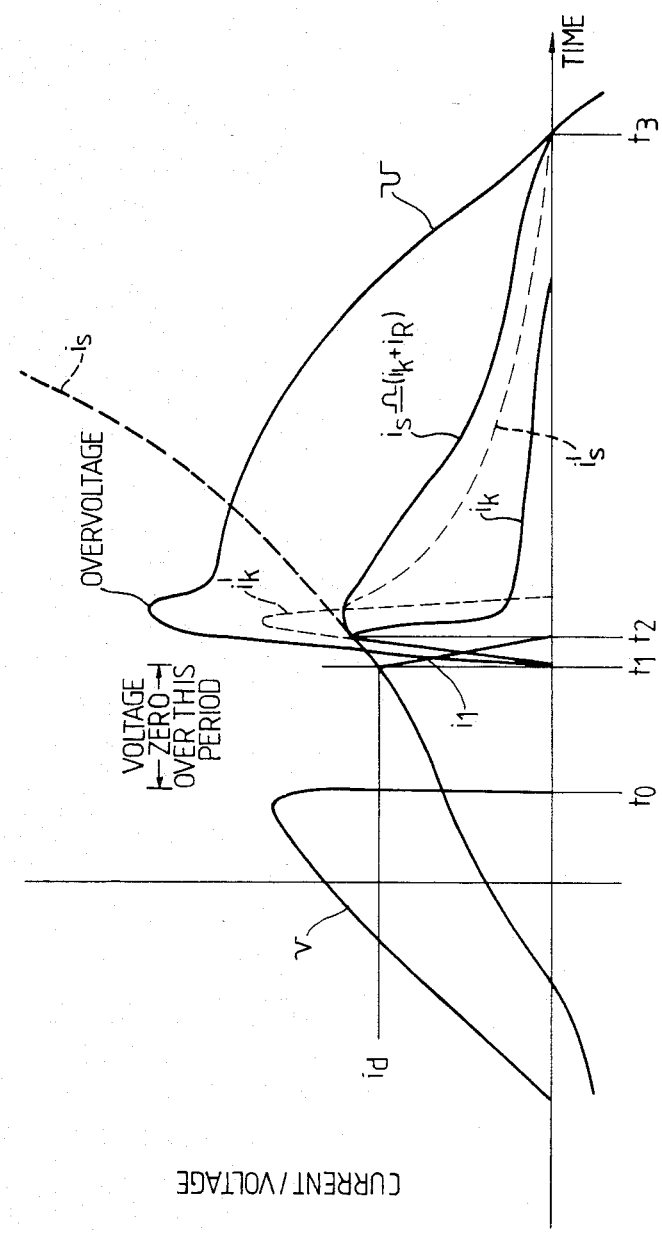
Figure 10:
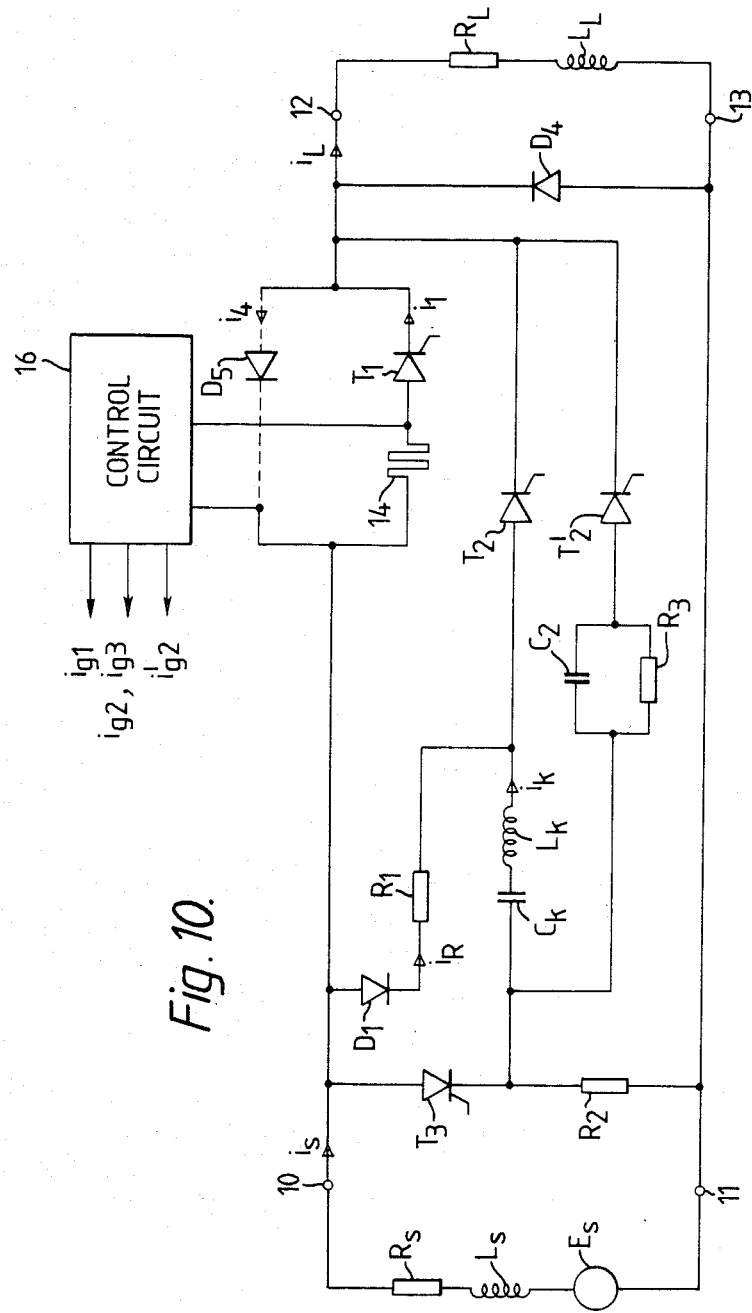

Certain embodiments of the invention will now be described, with reference to the accompanying drawings, in which:

FIG. 1 is a part-block, part-circuit, diagram of an internally energised thyristor circuit breaker according to the invention, FIGS. 2 and 3 show transient direct current waveforms which occur when light-load direct currents and short-circuit currents, respectively, are interrupted by the circuit breaker of FIGS. 1 and 10, FIGS. 4 and 5 show oscillograms of output voltages and currents obtained when short-circuit direct currents are interrupted by a prior art circuit breaker and the circuit breaker of FIG. 10, respectively, FIGS. 6 and 7 show transient current waveforms which occur when light-load alternating currents and short-circuit alternating currents, respectively, are interrupted by the circuit breaker of FIG. 1.

Figure 8:
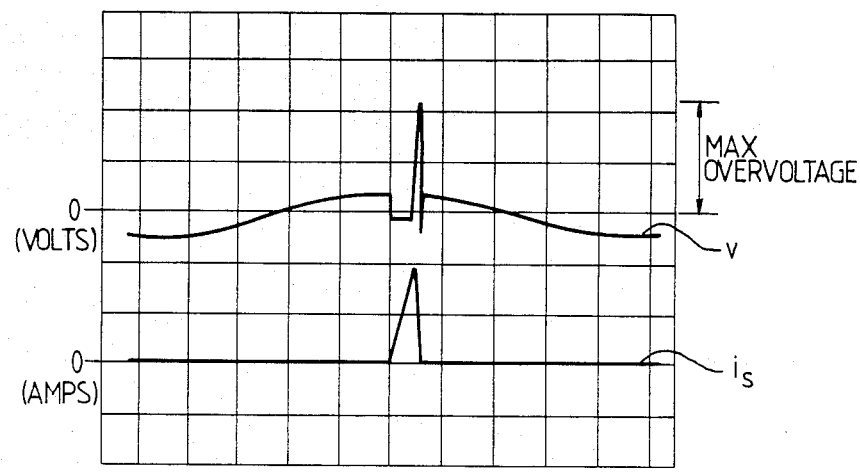
Figure 9:
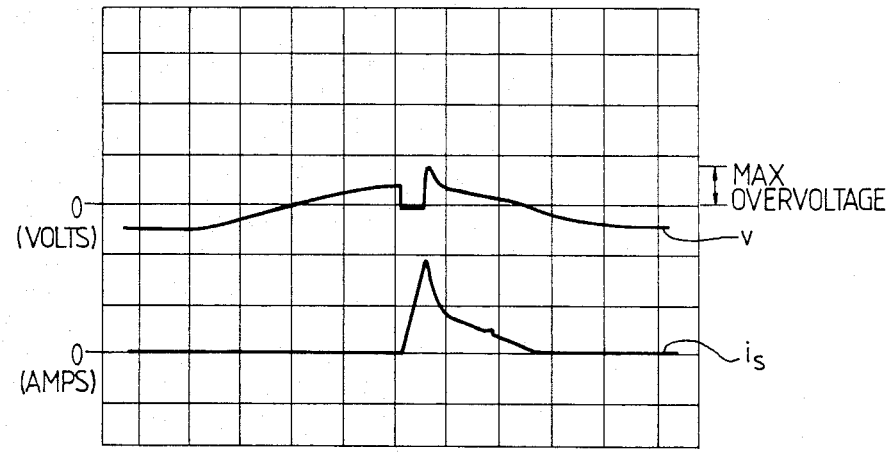
Figure 11:
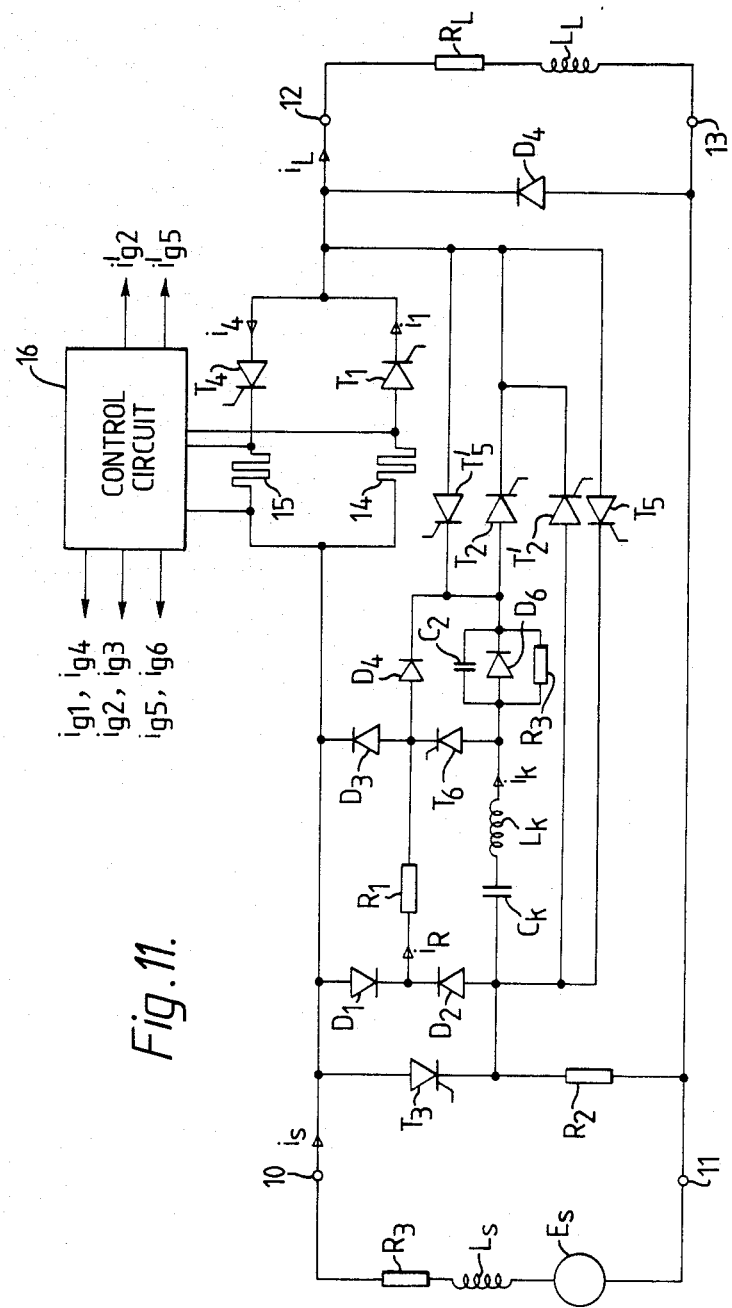
Figure 12:
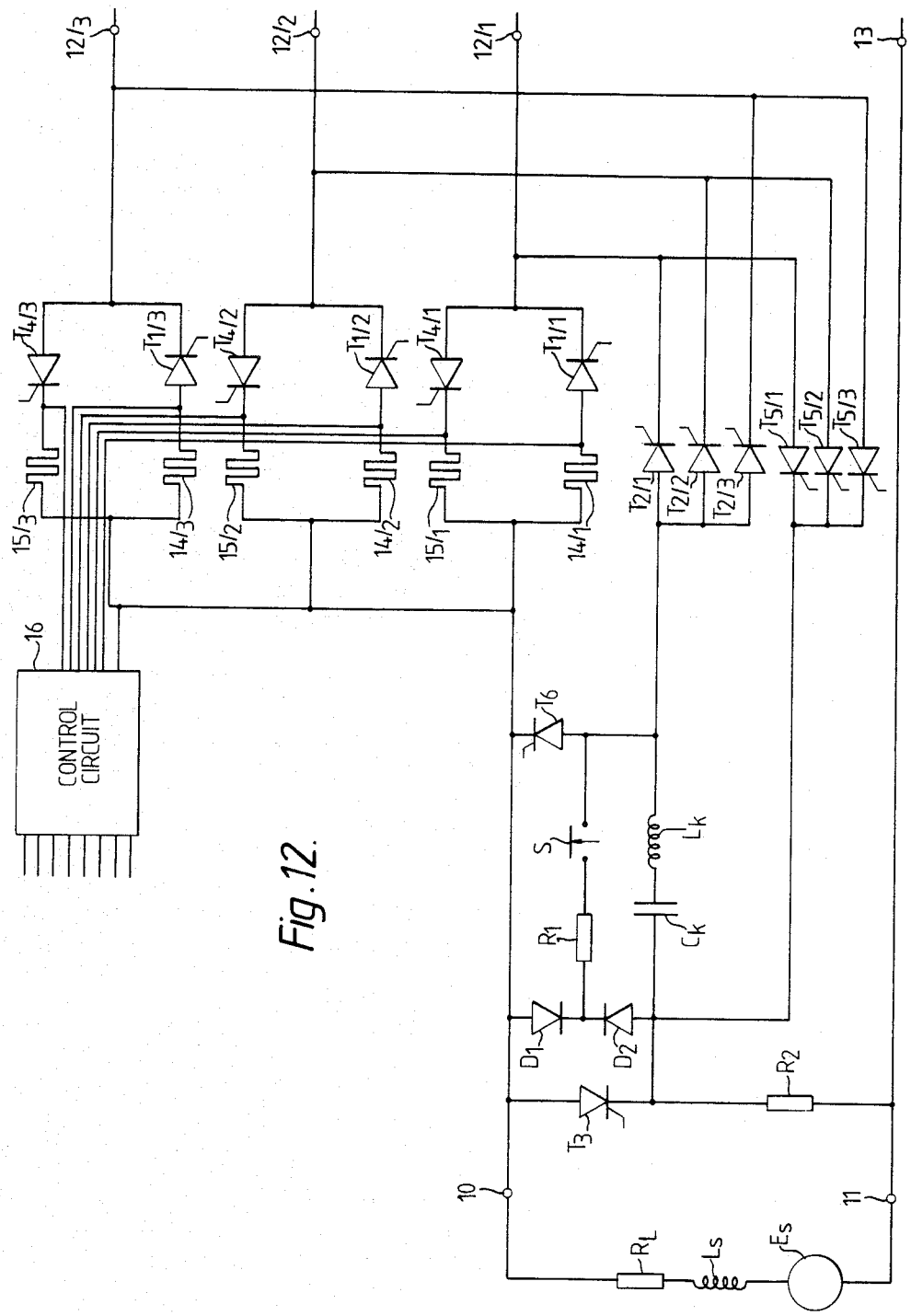
Figure 13:
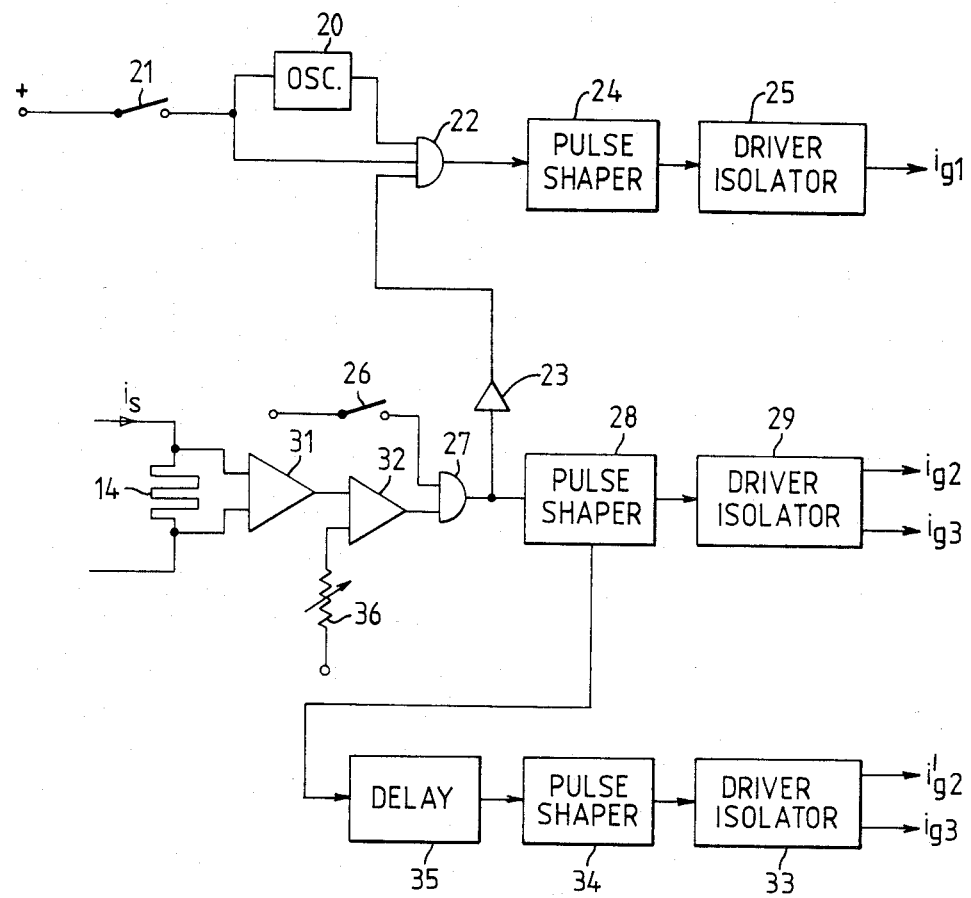

FIGS. 8 and 9 show oscillograms of output voltages and currents obtained when short circuit alternating currents are interrupted by a prior art circuit breaker and the circuit breaker of FIG. 1, respectively, FIG. 10 is a part-block, part-circuit, diagram of another thyristor circuit breaker according to the invention, wherein the second voltage peak which occurs during turn-off is controlled, FIG. 11 is a part-block, part-circuit, diagram of a circuit breaker according to the invention which is similar to FIG. 10 but allows bidirectional d.c. and a.c. to be interrupted, FIG. 12 is a part-block part-circuit diagram of a circuit breaker according to the invention for interrupting three circuits using a common commutation circuit, and FIG. 13 is a block diagram of a control circuit for use in FIGS. 1 and 10.

The circuit breaker of FIG. 1 can be used to interrupt either d.c. or a.c. For d.c. operation current flow is usually primarily in one direction but may reverse, at times, when a regenerative load is connected. The breaker is also useful in some d.c. distribution and switching circuits when current may flow in either direction. A few components are omitted for a.c. operation. The circuit will first be described in d.c. operation.

A direct current source having a voltage $E_s$, an internal resistance $R_s$ and an internal inductance $L_s$ is connected to input terminals 10 and 11 of the circuit breaker. A load with internal resistance $R_L$ and an internal inductance $L_L$ is connected to output terminals 12 and 13 of the circuit breaker. Current normally flows from the input terminal 10 to the output terminal 12 but may reverse when, for example, regeneration occurs. Thus current flow may be either by way of a thyristor $T_1$ and a low value sensing resistor 14 or by way of a thyristor $T_4$ and a low value sensing resistor 15. To initiate conduction a control circuit 16 applies either a firing pulse $i_{g1}$ to the thyristor $T_1$ or a firing pulse $i_{g4}$ to the thyristor $T_4$, depending on the direction in which current is to flow.

Fault conditions are sensed by the voltage across either of the resistors 14 or 15 increasing to become greater than a reference level set by a reference voltage in the control circuit 16. When such a fault is sensed from the voltage across the resistor 14 two thyristors $T_2$ and $T_3$ are turned on by firing pulses $i_{g2}$ and $i_{g3}$ but if it is the voltage across the resistor 15 which rises to indicate a fault, then two thyristors $T_5$ and $T_6$ are fired by means of pulses $i_{g5}$ and $i_{g6}$ from a control circuit 16. A free-wheel diode $D_4$ of known application is connected across the load to prevent reverse voltage (that is in the direction of conduction of the diode $D_4$) from occurring. When it is required to use the circuit breaker to interrupt under normal (that is non-fault) conditions then the appropriate pair of firing pulses is supplied by the control circuit 16 under, for example, manual control, the correct firing pulses being selected in dependence upon whether a voltage greater than zero exists across the resistor 14 or 15.

Considering current flow from the terminal 10 to the terminal 11, when circuit breaking is initiated by the firing pulses $i_{g2}$ and $i_{g3}$, a capacitor $C_k$ begins to discharge with a current $i_k$ through the thyristor $T_1$ by way of the thyristors $T_2$ and $T_3$ and an inductance $L_k$. The capacitor $C_k$ has been previously charged from the source $E_s$ (by way of a diode $D_1$, resistors $R_1$ and $R_2$, a switch S and the inductance $L_k$) in a sense which causes the initial discharge current from the capacitor to oppose the current in the thyristor $T_1$. The inductance $L_k$ may be a discrete component but it is often formed by stray inductances in the circuit and the internal inductance of the capacitor $C_k$. The switch S is preferably a contactor but alternatively a gate turn-off thyristor may be used.

Since the current $i_k$ from the capacitor $C_k$ flows in a capacitance-inductance circuit it is oscillatory. As has been mentioned, this current initially opposes current in the thyristor $T_1$, and thus the resultant current $i_1$ in the thyristor $T_1$ falls to zero as $i_k$ rises. Currents in the circuit are shown in FIG. 2 which relates to interrupting a light-load current. Current $i_s$ from the terminal 10 is at a steady value until interruption is initiated at a time $t_1$ when the current $i_k$ rises to a value $i_d$ which can be set as required. The current $i_1$ falls to zero as the current $i_k$ rises and the thyristor $T_1$ ceases conduction at a time $t_2$.

Shortly after the current in the thyristor $T_1$ reaches zero a current $i_s$ from the source $E_s$ is diverted along two main paths: firstly, as designated $i_R$, by way of the diode $D_1$, the resistor $R_1$, the switch S and the thyristor $T_2$, and secondly (as $i_k$) by way of the thyristor $T_3$, the capacitor $C_k$, the inductor $L_k$ and the thyristor $T_2$. The prospective capacitor current rises as shown by $i_k'$. The resistor $R_2$ has a comparatively high value compared with the resistor $R_1$. The current $i_k$ falls to zero as can typically be seen in FIG. 2 and at this point the thyristor $T_3$ ceases conduction. Some of the energy stored in the capacitor $C_k$ is then dissipated in the resistor $R_1$. The prospective value of $i_s$ is $E_s/(R_s+R_L)$ but after current diversion and cessation of conduction by the thyristor $T_3$, it reduces to a value of $E_s/(R_s+R_1+R_L)$ in the way shown in FIG. 2, provided $R_1$ is low so that current over damping occurs (since $R_1$ is in parallel with the capacitor $C_k$ and the inductor $L_k$). Most of the current now flowing through the terminal 10 passes by way of the resistor $R_1$.

At a time $t_3$ when $i_s$ is approximately constant the switch S is opened and current through the resistor $R_1$ transfers to a path formed by the thyristor $T_3$ triggered by a further firing pulse $i_{g3}$, the capacitor $C_k$, the inductance $L_k$ and the thyristor $T_2$. Since this path contains the capacitance $C_k$ the current decays to zero as indicated in FIG. 2 between the times $t_3$ when the switch S is opened and $t_4$ and the thyristors $T_2$ and $T_3$ cease conduction isolating the source from the load.

The switch S is operated by a conventional circuit (not shown) which after either of the pulses $i_{g1}$ or $i_{g4}$ has occurred compares the current $i_s$ with a limit determined by the steady current rating of the system and if below the limit initiates a delay until the time $t_3$ when a thyristor is fired operating a solenoid and opening the switch. The same signal is used to initiate the pulse $i_{g3}$ and so fire the thyristor $T_3$.

The capacitor $C_k$ charges to the voltage $E_s R_1/(R_s+R_1+R_L)$ at time $t_3$ and therefore the voltage across the capacitor $C_k$ is less than the source voltage $E_s$ when the switch S is opened. Since the current $i_s$ at time $t_3$ from the source is less than the same current at time $t_2$ the energy transferred to the capacitor $C_k$ from the source inductance $L_s$ is absorbed by the capacitor usually without exceeding twice the voltage $E_s$, provided the correct choice of component values is made.

Interruption of d.c. in the reverse direction, that is from the terminal 12 to the terminal 10, is now described. Under these conditions current flow is initially through the thyristor $T_4$ and to initiate interruption trigger pulses $i_{g5}$ and $i_{g6}$ are applied to thyristors $T_5$ and $T_6$. This has the effect of discharging the capacitor $C_k$ through the thyristor $T_4$ in the direction to oppose current flow between the terminals 10 and 12. Thus for the interruption of light-loads, currents flow in the way indicated in FIG. 2 except that the current $i_4$ in the thyristor $T_4$ replaces the current $i_1$. When the thyristor $T_4$ has ceased conduction current has been diverted by way of two paths: firstly, the thyristor $T_5$, the capacitor $C_k$, the inductance $L_k$ and the thyristor $T_6$, and secondly the thyristor $T_5$, the diode $D_2$, the resistor $R_1$, the switch S and the thyristor $T_6$. The second stage of interruption is again initiated by opening the switch S and triggering the thyristor $T_3$ into conduction so causing the current through the capacitor $C_k$ to decay to zero when the thyristors $T_5$ and $T_6$ cease conduction.

D.C. operation for current flow from the terminal 10 to the terminal 12 when a short circhit occurs across the terminals 12 and 13 is illustrated in FIG. 3. Initially the current $i_s$ from the source flows steadily but at a time $t_0$ a short circuit occurs when current rises rapidly as indicated by the line $i_{sc}$. When this current reaches a value $i_d$ and the voltage across the resistor 14 reaches the reference value held by the control circuit 16 interruption is initiated and then proceeds in the way already described. However, since when the thyristor $T_1$ is turned off current is diverted by way of the resistor $R_1$ the current $i_s$ from the source $E_s$ is limited after an initial rise, to a value approximately equal to $i_R = E_s/(R_1+R_s)$, as indicated in FIG. 3. The maximum voltage rise occurring at the terminals 10 and 13 is also reduced for the reasons given in connection with FIG. 2. D.C. short circuit operation for current flow in the opposite direction is similar.

FIGS. 4 and 5 are taken from oscillograms obtained from a prior art circuit and a prototype of the circuit of FIG. 1, respectively, and illustrate the relative voltage reduction obtained. The oscillograms were taken with a zero initial current and a short circuit applied at time $t_0$. The trace $E_0$ indicates the voltage appearing across the terminals 10 and 13 and it will be seen that this voltage initially falls to near zero when the short circuit is applied and then in FIG. 4 which relates to a prior art circuit rises to an over-voltage $V_0$. In FIG. 5 which relates to the circuit of FIG. 1, the zero voltage period is followed by two voltage peaks which are, with the component values used, of the same value. As can be seen, the maximum over-voltage shown in FIG. 4 exceeds twice that which occurs in FIG. 5. The trace for $i_s$ (the current from the source) in FIG. 5 shows that after an initial current increase which is roughly equal to that shown in FIG. 4 for $i_s$, the rate of current fall through the circuit breaker of FIG. 1 is much reduced during interruption.

When the circuit of FIG. 1 is used as an a.c. circuit breaker the switch S and the diode $D_4$ are omitted, the resistor $R_1$ being connected directly to the thyristors $T_2$ and $T_6$. Further the control circuit 16 provides firing pulses $i_{g1}$ and $i_{g4}$ for the thyristors $T_1$ and $T_4$ in each respective half-cycle of the applied a.c. voltage of the source $E_s$ when current is to flow but these pulses cease when interruption is initiated. Interruption during a positive half-cycle of the a.c. waveform is similar to that described for interruption for direct current when current flow is from the terminal 10 to the terminal 12 except that instead of the switch S being opened to switch off the thyristors $T_2$ and $T_3$ these thyristors cease conduction at the next current zero of the supply waveform. Interruption during a negative half-cycle is similar to that described for d.c. when current flows from the terminal 12 to the terminal 10 except that interruption of current flow thorugh the thyristors $T_5$ and $T_6$ occurs, as for positive half-cycles, when a current zero in the supply waveform is reached.

Currents and voltages for interruption during a positive half-cycle of an a.c. supply when a low value load is connected are shown in FIG. 6. The source current $i_s$ is interrupted at a time $t_1$ when the current $i_k$ causes the thyristor $T_1$ to cease conduction giving a current characteristic which is similar to that of FIG. 2 except that with decreasing applied sinusoidal voltage v the current diverted by way of the resistor $R_1$ and the thyristors $T_2$ and $T_3$ gradually falls to zero at time $t_3$. The thyristors $T_2$ and $T_3$ then cease conduction. A small over-voltage occurs at the time $t_2$ when the thyristor $T_1$ ceases to conduct. Similar curves but inverted are obtained when interruption occurs during a negative half-cycle with current flowing initially through the thyristor $T_4$ and being diverted through the thyristors $T_5$ and $T_6$.

FIG. 7 shows current and voltage characteristics when an a.c. load becomes short-circuited. When the source current $i_s$ reaches the reference level $i_d$ the control circuit 16 fires the thyristors $T_2$ and $T_3$ and interruption commences. As shown, the current $i_1$ through the thyristor $T_4$ ceases to conduct at the time $t_2$ and at this time a small over-voltage occurs following a period of zero voltage due to the short circuit between the times $t_0$ and $t_1$. Diversion of the current from the thyristor $T_1$ through the parallel combination of resistor $R_1$ and capacitance $C_k$ provides current limiting so that the source current $i_s$ follows the solid line shown after the time $t_2$ rather than the prospective current indicated by the interrupted line.

The oscillogram of FIG. 8 shows that the maximum over-voltage during short circuit, starting from zero load current, which occurs using a prior art circuit breaker is considerably more than twice as large as that shown in FIG. 9 obtained using a prototype circuit breaker according to FIG. 1.

The embodiment of the invention shown in FIG. 1 relates to thyristor circuit breakers in which the capacitor $C_k$ is initially charged from the source connected across the terminals 10 and 11. Such circuit breakers are known, in this specification, as internally energised thyristor circuit breakers, circuit breakers in which the capacitor $C_k$ is charged from a source external to the breaker being known as externally energised circuit breakers. In an externally energised breaker a d.c. source may be connected across the capacitor $C_k$. The operation of such a breaker is the same as that of FIG. 1 for both a.c. and d.c., and for light load switching and short circuit interruption, except that after the thyristor $T_1$ or $T_4$ ceases conduction, current from the terminal 10 flows through the resistor $R_1$ by way of the diode $D_2$ instead of the diode $D_1$. The resistor $R_2$ and the diode $D_1$ whose function is to charge the capacitor $C_k$ in internally energised breakers are omitted. For a.c. operation the switch S is also omitted and the resistor $R_1$ is directly connected to the thyristors $T_2$ and $T_6$.

In an improved version of the circuit of FIG. 1 the switch S is replaced by means for commutating the current in thyristor $T_2$ to another circuit. Such a circuit is shown in FIG. 10 for a d.c. circuit breaker in which the thyristor $T_4$ and its commutation components are omitted. Optionally a diode $D_5$ may be provided to allow any reverse currents from the terminal 12 to flow back to the source $E_s$. Operation of the circuit of FIG. 10 is as described for FIG. 1 for d.c. operation in one direction up to the point where the current $i_R$ reaches a steady value. A thyristor $T'_2$ is then fired by means of a pulse $i'_{g2}$ and at this time the capacitor $C_k$ is charged in such a direction that the capacitor current through the thyristor $T'_2$ opposes current in the thyristor $T_2$ so that the latter ceases to conduct. The thyristor $T'_2$ is usually in an oscillatory circuit with the capacitor $C_k$ so it also ceases to conduct at the next current zero.

Commutation of the thyristor $T_2$ causes the second voltage peak shown in FIG. 5 to occur and a capacitor $C_2$ and a resistor $R_3$ are provided to control the rate of current fall and the magnitude of this peak. Initially the capacitor $C_2$ acts as a short circuit so that the full commutating current is supplied to the thyristor $T_2$ but as $C_2$ becomes charged the effect of resistor $R_3$ on the current becomes significant and the magnitude of the second peak depends on the choice of these two components. By heuristic choice of the values for $R_1$, $R_3$, $C_k$ and $C_2$ the first and second peaks can be made approximately equal to one another and in this condition it is believed that the maximum switching over-voltage which occurs during current interruption is reduced to a minimum value. The resistor $R_3$ is generally in the range $3R_1$ to $0.25\ R_1$ and the capacitor $C_2$ is much smaller in value than the capacitor $C_k$, typically less than $C_k/10$. However when $R_3 < R_1$, $C_2$ may be omitted.

FIG. 11 shows a modified version of FIG. 10 which allows bidirectional d.c. to flow and also interrupts a.c. more effectively than the circuit of FIG. 1. In addition to the thyristor $T_4$, the thyristor $T_5$ and its associated diode $D_2$ which commutate the thyristor $T_4$, a thyristor $T'_5$ is provided to commutate the thyristor $T_5$. A thyristor $T_6$ and diodes $D_4$ and $D_6$ are also required, and the parallel combination of the capacitor $C_2$ and the resistor $R_3$ is now optionally positioned between the capacitor $C_k$ and the thyristor $T_2$.

The charging circuit for the initial charge on the capacitor $C_k$ is now by way of the diode $D_1$, the resistor $R_1$, the diode $D_4$, the resistor $R_3$, the inductor $L_k$ and the resistor $R_2$. When the thyristor $T_1$ is commutated current passes from the capacitor $C_k$ through the diode $D_6$ and the thyristors $T_2$ and $T_3$. By the time the thyristor $T_2$ is to be commutated the capacitor $C_k$ has become charged in the opposite sense to its initial charge and when $T'_2$ is fired current passes round the loop containing the thyristor $T'_2$, the thyristor $T_2$, the parallel combination of the capacitor $C_2$ and the resistor $R_3$ and the inductor $L_k$. As before the commutation of the thyristor $T_2$ takes place when the current passing by way of this thyristor has reached a steady value. The control circuit 16 is arranged to generate the required trigger pulse $1'_{g2}$ as soon as this steady value is reached.

When current flow is in the opposite direction between the terminals 10 and 12 and the thyristor $T_4$ is to be commutated, the thyristors $T_5$ and $T_6$ are fired by means of firing pulses $i_{g5}$ and $i_{g6}$ and current flows by way of the thyristor $T_6$, the diode $D_3$, the thyristor $T_4$, and the thyristor $T_5$. As soon as thyristor $T_4$ has ceased to conduct and the current in the thyristor $T_5$ has settled to a reasonably steady value, the control circuit 16 emits a firing pulse $i'_{g5}$ which fires the thyristor $T'_5$ so that current flows round the loop containing the thyristor $T_5$, the thyristor $T'_5$ and the parallel combination of the capacitor $C_2$ and the resistor $R_3$.

The use of the diode $D_6$ allows the capacitor $C_2$ to be electrolytic but it is thought that by suitable choice of the resistor $R_3$ it is possible to operate the circuit of FIG. 11 without the diode $D_6$.

It has been found that the capacitor $C_k$ can also be formed by two electrolytic capacitors connected in series with like electrodes connected together so that the capacitors are oppositely poled. More than one such capacitor pair may be used in series or parallel combinations. Diodes are preferably connected in parallel with the capacitors of each pair or each combination of capacitor pairs with the anodes connected to respective capacitor positive electrodes.

As with the circuit of FIG. 10 a suitable choice of the resistors $R_1$ and $R_3$ and the capacitors $C_k$ and $C_2$ results in a minimum peak switching over-voltage. The switching over-voltage again has two peaks and the minimum over-voltage is thought to occur when the above component values are so chosen that these peaks have approximately the same value.

The effect of the parallel combination of the capacitor $C_2$ and the resistor $R_3$ can be seen for d.c. operation in FIG. 2 where the dashed line IR' shows that interruption of current through the thyristor $T_2$ has taken longer than when the switch S was employed. By slowing the rate of change of current through the thyristor $T_2$ the resulting switching over-voltage is reduced as can be seen from the dashed curve EO' in FIG. 5. The effect of a parallel combination of the capacitor $C_2$ and the resistor $R_3$ is similar in a.c. switching in that the switching over-voltage can be minimised but in addition the introduction of the parallel circuit reduces the current $i_s$ as shown by the line $i'_s$ in FIG. 6 so that the load current rapidly falls to a low value which may be considered as, in effect, interrupted.

If required, two parallel combinations of the type mentioned above may be used in a bidirectional d.c. or a.c. circuit breaker. If so the diode $D_6$ can be omitted and one parallel combination is positioned as shown in FIG. 10 while the other is connected between the thyristor $T'_5$ and the terminal 12.

The circuit of FIG. 10 can be made the basis for a bidirectional circuit breaker arrangement so long as the diode $D_5$ is included. For example supposing a relatively simple circuit modular breaker is required for general use, then several such breakers based on FIG. 10 can be used to interrupt the connection between a power supply and a number of loads. Several breakers as shown in FIG. 10 are connected between the power supply $E_s$ and respective loads but the cathodes of the diodes $D_5$ of these breakers are each connected to a further circuit breaker of the same type but oppositely connected instead of being returned to the terminal 10. The common power supply is connected to the terminal 12 of the oppositely connected breaker and the cathodes of the parallel connected diodes $D_5$ are connected to the terminal 10, so that the thyristor $T_1$ of this further breaker is oppositely poled (relative to the other circuit breakers) with respect to the source $E_s$. In the additional circuit breaker the diode $D_5$ is either not connected or is absent.

The invention may be applied to multicircuit protection utilising a single commutation circuit for switching any practical number of parallel connected oppositely poled thyristor pairs coupling loads and/or sources. In FIGS. 12 a modified form of the circuit of FIG. 1 is connected in this way to interrupt current flow through any of three pairs of parallel connected thyristor pairs $T_{1/1}$ and $T_{4/1}$, $T_{1/2}$ and $T_{4/2}$, and $T_{1/3}$ and $T_{4/3}$. In FIG. 11 the figure after an oblique stroke in the designation of a component relates that component to one of the three pairs of thyristors. The control circuit 16 has nine output connections which generate trigger pulses for thyristors as indicated in the following Table:

| Control circuit output terminal | Firing pulses | Applied to thyristors |
| --- | --- | --- |
| 1 | $i_{g1/1}$, $i_{g4/1}$ | $T_{1/1}$, $T_{4/1}$ |
| 2 | $i_{g1/2}$, $i_{g4/2}$ | $T_{1/2}$, $T_{4/2}$ |
| 3 | $i_{g1/3}$, $i_{g4/3}$ | $T_{1/3}$, $T_{4/3}$ |
| 4 | $i_{g2/1}$, $i_{g3}$ | $T_{2/1}$, $T_3$ |
| 5 | $i_{g2/2}$, $i_{g3}$ | $T_{2/2}$, $T_3$ |
| 6 | $i_{g2/3}$, $i_{g3}$ | $T_{2/3}$, $T_3$ |
| 7 | $i_{g5/1}$, $i_{g6}$ | $T_{5/1}$, $T_6$ |
| 8 | $i_{g5/2}$, $i_{g6}$ | $T_{5/2}$, $T_6$ |
| 9 | $i_{g5/3}$, $i_{g6}$ | $T_{5/3}$, $T_6$ |

The capacitor $C_k$ has approximately the same value and rating as the capacitor for a single circuit breaker and the operation of FIG. 11 will be clear from the description of FIG. 1. As in FIGS. 1 and 10 the switch S is omitted for a.c. working, and the resistor $R_1$ is connected directly to the thyristor $T_6$.

In order to obtain a 50% reduction in the maximum switching over-voltage (with the two stage turn off breaker of FIG. 10, for example) relative to known prior circuit breakers, it is necessary that $C_k$, $R_1$ and $L_k$ satisfy the following criteria with respect to the maximum fault setting ($I_{d\ max}$), the circuit supply voltage ($E_s$) and the source impedance ($L_s$, $R_s$) under short circuit conditions:

$$C_k \simeq \frac{L_s}{6.75} \left( \frac{I_{d\,max}}{E_s} \right)^2$$

$$R_1 \simeq \frac{2 E_s}{I_{d\,max}}$$

$$L_k \simeq \frac{L_s}{27}$$

For these values the maximum switching over-voltage is of the order, but less than, twice the system voltage ($2 E_s$) when the breaker interrupts the maximum fault current at the maximum current setting.

The SCR devices $T_1$, $T_2$, $T_3$ and $T_4$ may be chosen on the basis of current, voltage and turn-off time ratings, such that $$\frac{di}{dt_{crit}} > \frac{E_s}{L_k} \quad \text{for } T_2, T_3$$

$$\frac{di}{dt_{crit}} > \frac{E_s}{L_s} \quad \text{for } T_1, T_4$$

$$t_q < \frac{2}{3} \pi \sqrt{C_k L_k} \quad \text{for } T_1, T_4$$

where $di/dt_{crit}$, $t_q$ are the maximum di/dt rating of respective SCR devices and the minimum turn-off time respectively. P Specific examples of component values are now also given for the circuit of FIG. 1 and a source having inductance $L_s$ of 30 to 40 μH, a ratio of $R_s$/reactance of 0.25, and a voltage $E_s$ of 660 V, with a peak turn off current ($\hat{i}_k$) of 16 kA:

Capacitor $C_k$—2000 μF, 2500 V,
Inductance $L_k$—3 μH,
Thyristors $T_1$, $T_4$—Average current rating 3000 A, di/dt 400 A/μS and dV/dt 400 V/μS,
Thyristors $T_2$, $T_3$, $T_5$, $T_6$—20 kA for 10 mS,
Resistor $R_1$—0.25 Ω, 2500 A for 30 mS,
Resistor $R_2$—1000 Ω,
Switch S—1000 Vdc contactor, 2500 A for 30 mS.

The control circuit 16 for FIGS. 1 and 10 is now described in more detail with reference to FIG. 13. When the circuit breaker is to be switched on a positive voltage is supplied to an oscillator 20 by switching means shown schematically at 21. The oscillator 20 then generates 1.5 kHz square pulses and passes them to an AND gate 22 which is enabled by the switching means 21 and from an inverter 23. Pulses at the output of the AND gate 22 are fed to a pulse shaping circuit 24 which converts the incoming pulses to a train of 60 microsecond, 1.5 kHz pulses. The output from the circuit 24 enables a driver isolator 25 which provides an isolated high current pulse supply forming the pulses $i_{g1}$ for the thyristor $T_1$.

The circuit breaker may be turned off either manually by way of switching means shown schematically at 26 or as a result of high current through the series resistor 14. When the switching means 26 is operated a positive voltage is applied to an OR gate 27 and the output of this gate disables and AND gate 22 by means of the inverter 23 so causing the pulses $i_{g1}$ to cease. At the same time a level change at the OR gate output causes a pulse shaping circuit 28 to generate a 60 microsecond pulse which is then applied to a driver isolating circuit 29 to give pulses $i_{g2}$ and $i_{g3}$. The pulse shaper 28 also generates a pulse for the input of a delay circuit 35 having a time delay $t_d$ equal to the interval between $t_2$ and $t_3$. At the end of this delay a further pulse shaping circuit 34 and driver isolator 33 generate pulses $i'_{g2}$ and $i_{g3}$, and in addition, for the circuit of FIG. 1, a pulse for the operating coil of the switch S.

The voltage across the shunt resistor 14 is amplified using an isolating amplifier 31 which may be, for example, Analogue Devices type AD289J. Such an amplifier provides electrical isolation and accurate amplification of any transient or steady state voltage at its input. As is known components are connected to the amplifier to offset zero drift and temperature effects.

The output voltage of the amplifier 31 is compared in a comparator 32 with a reference voltage which, in effect, sets $i_d$ obtained from a potentiometer 36 connected to a reference voltage. When overcurrent occurs and the output of the amplifier 31 exceeds the reference voltage, the OR gate 27 is enabled and the pulse train $i_{g1}$ is terminated while pulses $i_{g2}$ and $i_{g3}$ are initiated.

The pulse shaping circuits may be constructed from a CMOS monostable circuit such as the IC4528B and a type NE556 timer circuit. The driver isolating circuits comprise amplifiers connected in series with either an optocoupler or a ferrite core pulse transformer. Further National Semiconductor Type 311 may be used as the comparator 32 and the delay circuit 35 may be an NE555 circuit.

From the specific examples of the invention described, it will be apparent that the invention can be put into practice in many other ways. For example other commutation circuits can be used, provided the principle of diverting current by way of parallel resistive capacitive means away from a main switching means and later interrupting that current, is used, when the switching circuit is to isolate a load from its supply. The circuits shown may be adapted to employ vacuum interrupters and trigger gap switches, or other switching devices.

It will be understood that embodiments of the invention such as those shown in FIGS. 1, 10, 11 and 12 usually include standard protection circuits for instances "snubbers" or spark gaps (voltage arresters) which are not shown but are familiar to those engaged in the design and manufacturer of power thyristor-based equipment.

We claim:
1. A circuit breaker comprising:
first switching means connected to carry current between a first terminal and a second terminal of the circuit breaker, the first switching means including a gated switching means which when conducting current remains in a low impedance state until, at least, the current ceases,
control means for providing a switching signal when the circuit breaker is required to cease carrying the current,
first commutation means including a capacitor means forming part of an inductance-capacitance circuit,
second switching means for connecting the inductance-capacitance circuit across the first switching means,
means for charging the capacitor means to cause the capacitor means to pass, when the second switching means conducts, an opposing current to the first switching means which opposes current between the first terminal and the second terminal flowing in the first switching means, means for setting the second switching means into a conducting state on the occurrence of the switching signal to cause the opposing current to flow in the first switching means whereby total current therein falls to zero, resistive means connected in a path between said first and said second terminals to provide an alternative circuit to substitute for the first switching means after the total current flow has fallen to zero, for current passing into the circuit breaker by way of the first terminal, and second commutation means different from the first commutation means for causing current through the resistive means to cease at the end of an interval which follows the cessation of current flow in the first switching means, the second commutation means including current-controlling means coupled to said path to control current flow therein, the capacitor means being connected in the inductance-capacitance circuit to pass transient current flowing between the first and second terminals and store significant energy, so reducing the maximum switching over-voltage appearing at the second terminal, when the first switching means ceases conduction.

2. A circuit breaker according to claim 1 for interrupting currents for a source having a known internal inductance and in which the source current value at which operation is initiated is variable and, under short circuit conditions, half the energy stored in the source inductance, within a range of 20% thereof, being transferred to the capacitor means commencing immediately after the first switching means ceases conduction.

3. A circuit breaker according to claim 1 wherein a resistive means is connected to reduce the rate of change of current from the capacitor means when the second switching means initially conducts.

4. A circuit breaker according to claim 1 wherein the resistive means is connected in parallel with the first switching means between the first and second terminals by way of the second switching means.

5. A circuit breaker according to claim 1 for interrupting direct current from the second terminal to the first terminal, current flow in the opposite direction, or to interrupt alternating current, wherein the first switching means conducts current in both directions, and the second switching means and the capacitor means pass a current to the first switching means which opposes the which flows therethrough at the time of interruption.

6. A circuit breaker according to claim 2 for interrupting direct currents wherein the first switching means comprises a single thyristor, and the second switching means comprises two further thyristors arranged to connect the capacitor means and the resistive means across the said single thyristor in such a sense that when the second switching means conducts the current from the capacitor means opposes current flow in the single thyristor.

7. A circuit breaker according to claim 2 for interrupting bidirectional direct currents or alternating current wherein the first switching means comprises two parallel connected oppositely poled thyristors, and the second switching means comprises two pairs of further thyristors arranged to connect a respective one of the parallel connected thyristors across the capacitor means in a sense which causes current from the capacitor means to oppose current in that thyristor.

8. A circuit breaker according to claim 1 wherein the second switching means comprises gated switching means and the second commutation means comprises third switching means connected to pass a current through the second switching means in a direction which opposes that current which flows therein after the first switching means has ceased conduction, the third switching means being set into a conducting state after the first switching means has ceased conduction.

9. A circuit breaker according to claim 8 including means for controlling the rate of change of current in the second switching means.

10. A circuit breaker according to claim 9 wherein the means for controlling the rate of change of current comprises a parallel combination of a capacitor and resistor connected in series between the second and third switching means.

11. A circuit breaker according to claim 8 wherein the third switching means comprises a thyristor connected to pass current from the capacitor means to oppose current flow in one of the two further thyristors.

12. A circuit breaker according to claim 8 wherein the third switching means comprises respective thyristors for, and associated with, the pairs of further thyristors, each of the said respective thyristors being connected to pass current from the capacitor means to oppose current flow in one of the thyristors in its associated thyristor pair.

13. A circuit breaker according to claim 6 wherein the second commutation means comprises switch means in series with the further thyristors for interrupting current therein.

14. A circuit breaker according to claim 7 wherein the second commutation means comprises the second switching means.

15. A circuit breaker according to claim 19 wherein the means for charging the capacitor means comprises rectifier means and further resistive means connected to provide a path for d.c. between the first terminal and a common input/output terminal of the circuit breaker.

16. A circuit breaker according to claim 1 wherein the capacitor means comprises at least one pair of electrolytic capacitors with like electrodes of the capacitors of each pair connected together.

17. A circuit breaker according to claim 1 including two diodes, each connected across a respective one of the capacitors and poled to conduct current which would not polarize that capacitor.

18. A circuit breaker according to claim 1 for connection between a single power supply and a plurality of loads, wherein one first and one second switching means are provided for each load, the capacitor means being common to all first switching means and connected to pass current to one of the first switching means when current in a load associated with that switching means is to be interrupted.

* * * * *